(12) United States Patent
Rhee

(10) Patent No.: US 12,170,345 B2
(45) Date of Patent: Dec. 17, 2024

(54) DISPLAY DEVICE USING SEMICONDUCTOR LIGHT-EMITTING ELEMENT, AND MANUFACTURING METHOD THEREFOR

(71) Applicant: LG ELECTRONICS INC., Seoul (KR)

(72) Inventor: Byungjoon Rhee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 418 days.

(21) Appl. No.: 17/631,781

(22) PCT Filed: Sep. 3, 2019

(86) PCT No.: PCT/KR2019/011277
§ 371 (c)(1),
(2) Date: Jan. 31, 2022

(87) PCT Pub. No.: WO2021/033822
PCT Pub. Date: Feb. 25, 2021

(65) Prior Publication Data
US 2022/0278254 A1    Sep. 1, 2022

(30) Foreign Application Priority Data
Aug. 21, 2019    (KR) .................... 10-2019-0102625

(51) Int. Cl.
*H01L 33/38*    (2010.01)
*H01L 25/075*    (2006.01)
(Continued)

(52) U.S. Cl.
CPC ........ *H01L 33/382* (2013.01); *H01L 25/0753* (2013.01); *H01L 33/005* (2013.01);
(Continued)

(58) Field of Classification Search
CPC ......... H01L 33/00; H01L 33/36; H01L 33/38; H01L 33/50; H01L 33/58; H01L 33/62;
(Continued)

(56) References Cited

U.S. PATENT DOCUMENTS 7,859,606 B2 * 12/2010 Higaki ............... H01L 29/786
349/42
2010/0148198 A1    6/2010 Sugizaki et al.
(Continued)

FOREIGN PATENT DOCUMENTS

EP    2197051    6/2010
KR    10-0631416    10/2006
(Continued)

OTHER PUBLICATIONS

PCT International Application No. PCT/KR2019/011277, International Search Report dated May 21, 2020, 4 pages.
Korean Intellectual Property Office Application No. 10-2019-0102625, Office Action dated Mar. 12, 2024, 6 pages.
European Patent Office Application Serial No. 19941941.7, Search Report dated Aug. 24, 2023, 8 pages.

*Primary Examiner* — Chuong A Luu
(74) *Attorney, Agent, or Firm* — LEE, HONG, DEGERMAN, KANG & WAIMEY

(57) ABSTRACT

The present invention provides a display device using a semiconductor light-emitting element and a manufacturing method therefor, the display device transferring semiconductor light-emitting elements on a temporary substrate, and then directly implementing, through a stack process, the structure of a wiring substrate on the temporary substrate on which the semiconductor light-emitting elements are arrayed, thereby enabling the semiconductor light-emitting elements and the wiring substrate to be electrically connected.

6 Claims, 10 Drawing Sheets

(51) Int. Cl.
  *H01L 33/00* (2010.01)
  *H01L 33/50* (2010.01)
  *H01L 33/62* (2010.01)

(52) U.S. Cl.
  CPC ............ *H01L 33/501* (2013.01); *H01L 33/62* (2013.01); *H01L 2933/0016* (2013.01); *H01L 2933/0041* (2013.01); *H01L 2933/0066* (2013.01)

(58) Field of Classification Search
  CPC ................. H01L 33/382; H01L 33/005; H01L 33/501; H01L 25/16; H01L 25/167; H01L 25/075; H01L 25/0753; H01L 27/15; H01L 27/156; H01L 2933/0016; H01L 2933/0041; H01L 2933/0058; H01L 2933/0066; H01L 33/22; H01L 33/44; H01L 33/48; H01L 33/20; H01L 33/64; H01L 33/486; H01L 33/32; H01L 33/40; H01L 33/405; H01L 33/0079; H01L 33/007; H01L 33/0025; H01L 24/14
  USPC .......................................................... 257/79
  See application file for complete search history.

(56) References Cited

U.S. PATENT DOCUMENTS

| | | |
|---|---|---|
| 2012/0012882 A1 | 1/2012 | Shiue et al. |
| 2016/0043061 A1 | 2/2016 | Rhee |
| 2017/0229626 A1* | 8/2017 | Yang ..................... H01L 33/007 |
| 2017/0263817 A1 | 9/2017 | Hirano et al. |
| 2019/0019816 A1 | 1/2019 | Kang et al. |
| 2019/0203904 A1 | 7/2019 | Lee et al. |
| 2020/0235077 A1 | 7/2020 | Jeon et al. |
| 2022/0085249 A1* | 3/2022 | Do .......................... H01L 33/20 |

FOREIGN PATENT DOCUMENTS

| | | |
|---|---|---|
| KR | 10-0667508 | 1/2007 |
| KR | 10-2010-0036617 | 4/2010 |
| KR | 10-2017-0109025 | 9/2017 |
| KR | 10-2017-0129342 | 11/2017 |
| KR | 10-2018-0089771 | 8/2018 |
| KR | 10-2019-0082567 | 7/2019 |

* cited by examiner

[FIG. 1]
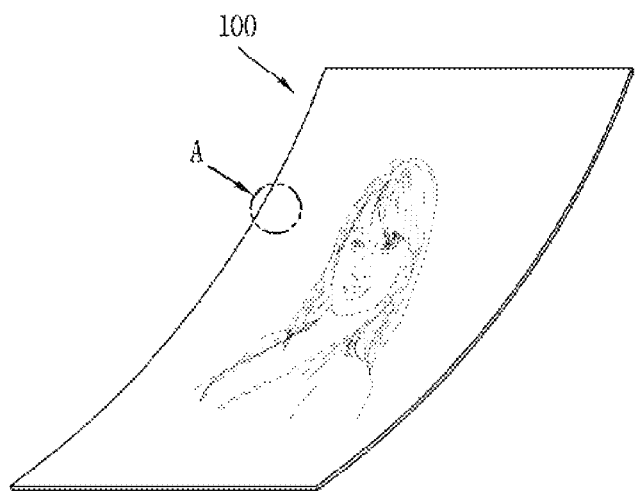
[FIG. 2]
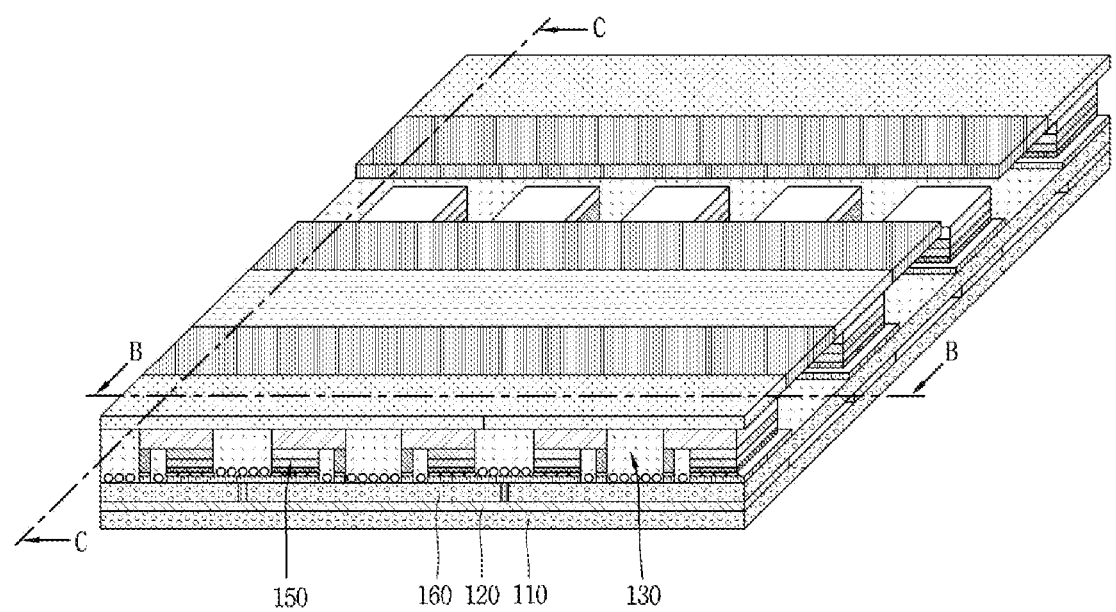

[FIG. 3a]
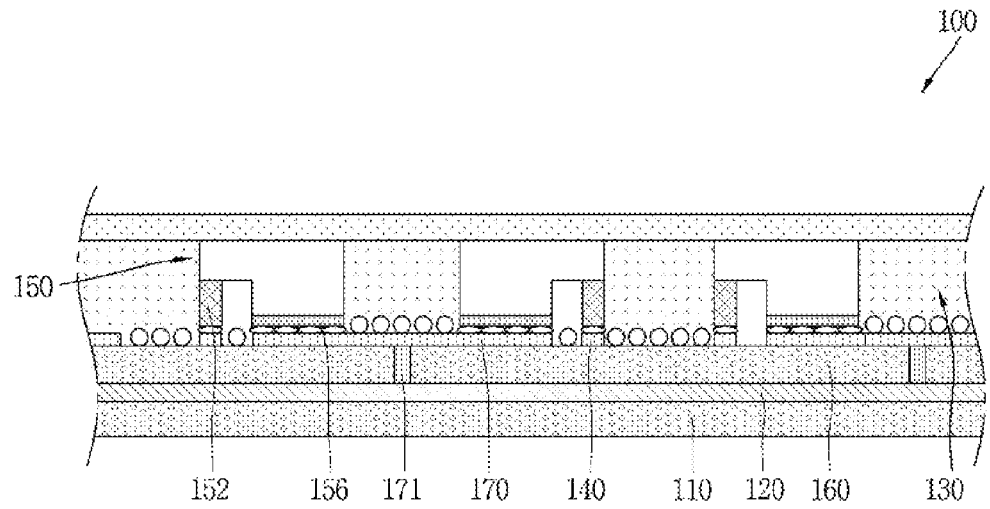
[FIG. 3b]
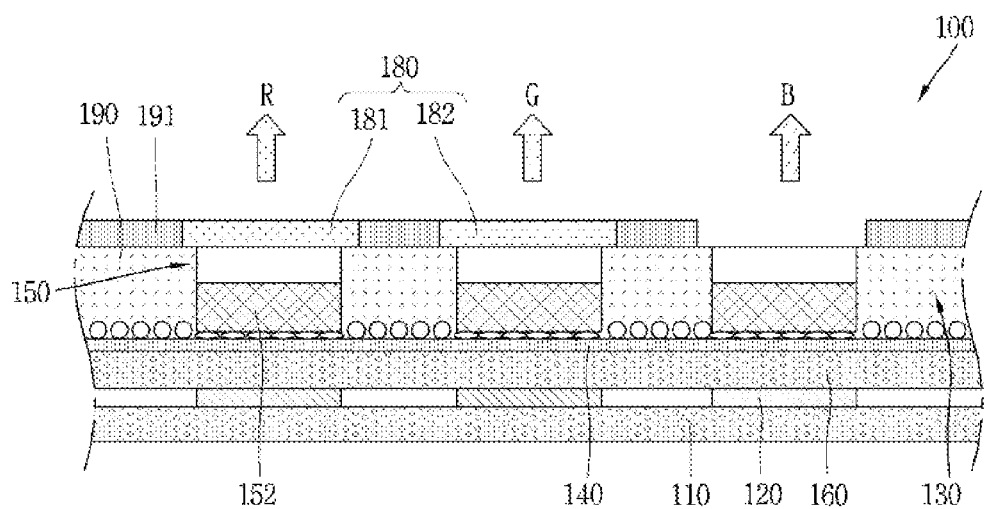

[FIG. 4]
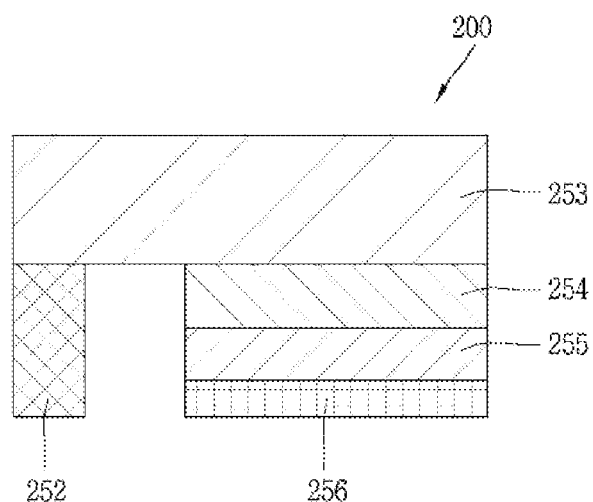

【FIG. 5a】
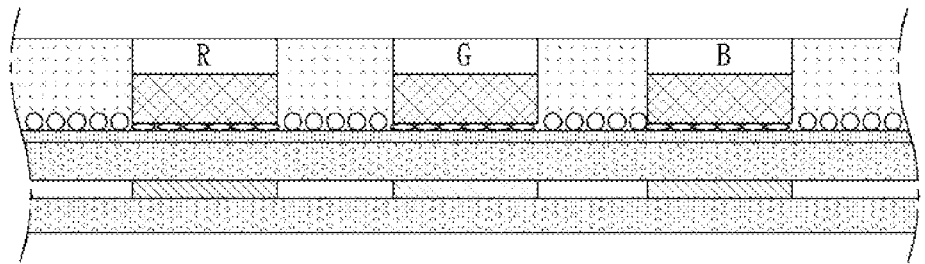
【FIG. 5b】
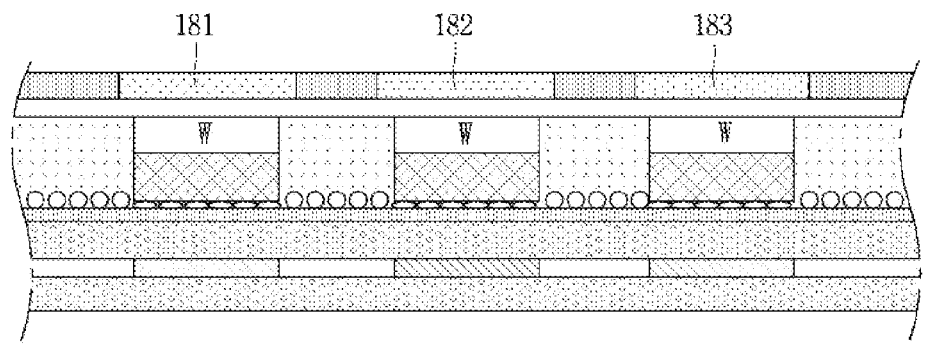
【FIG. 5c】
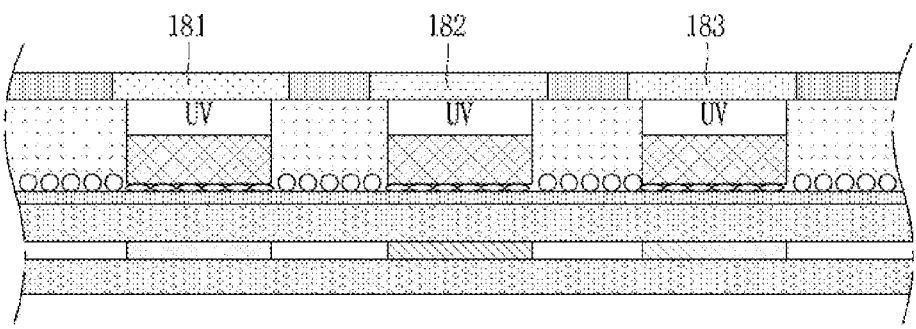

[FIG. 6]
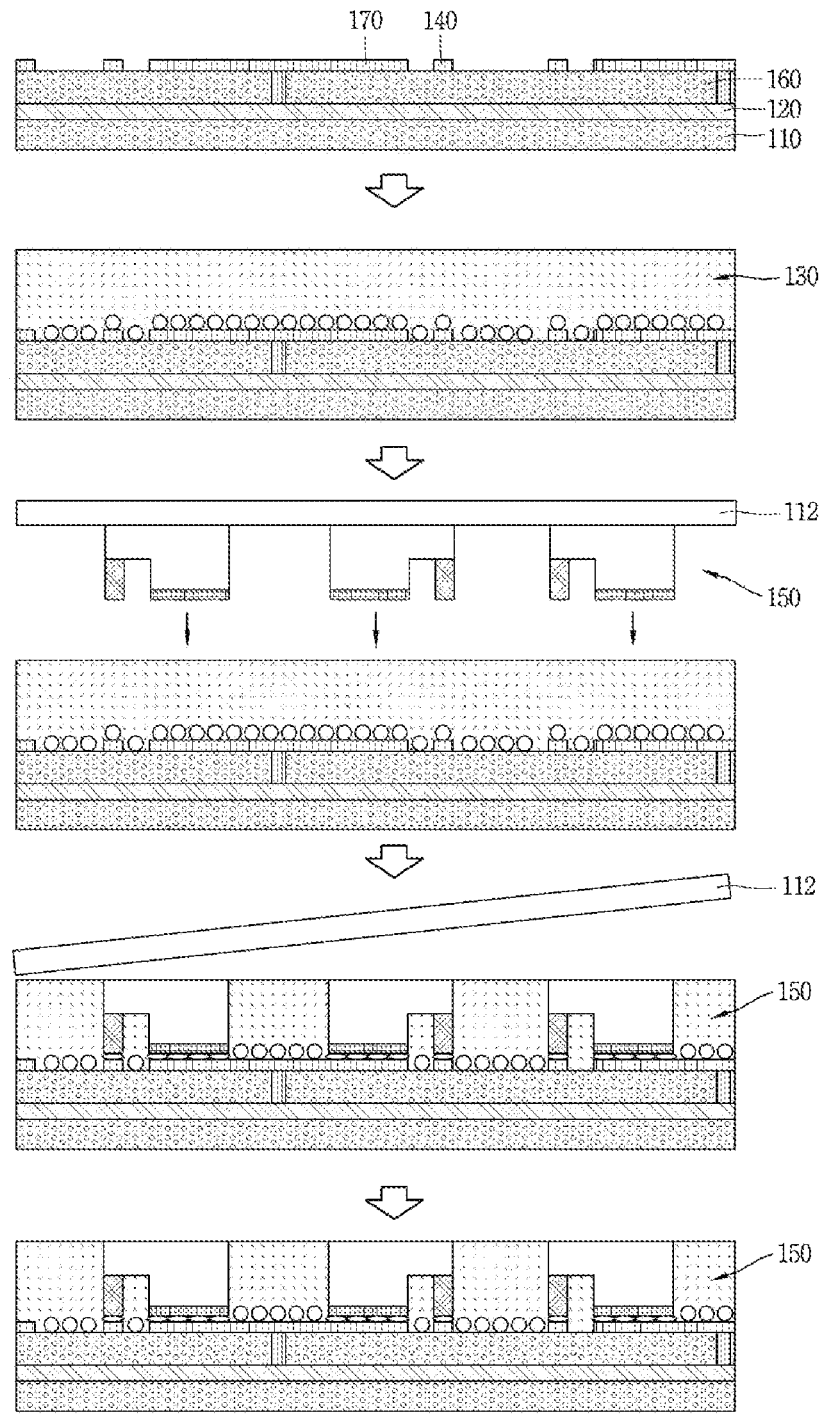

[FIG. 7]
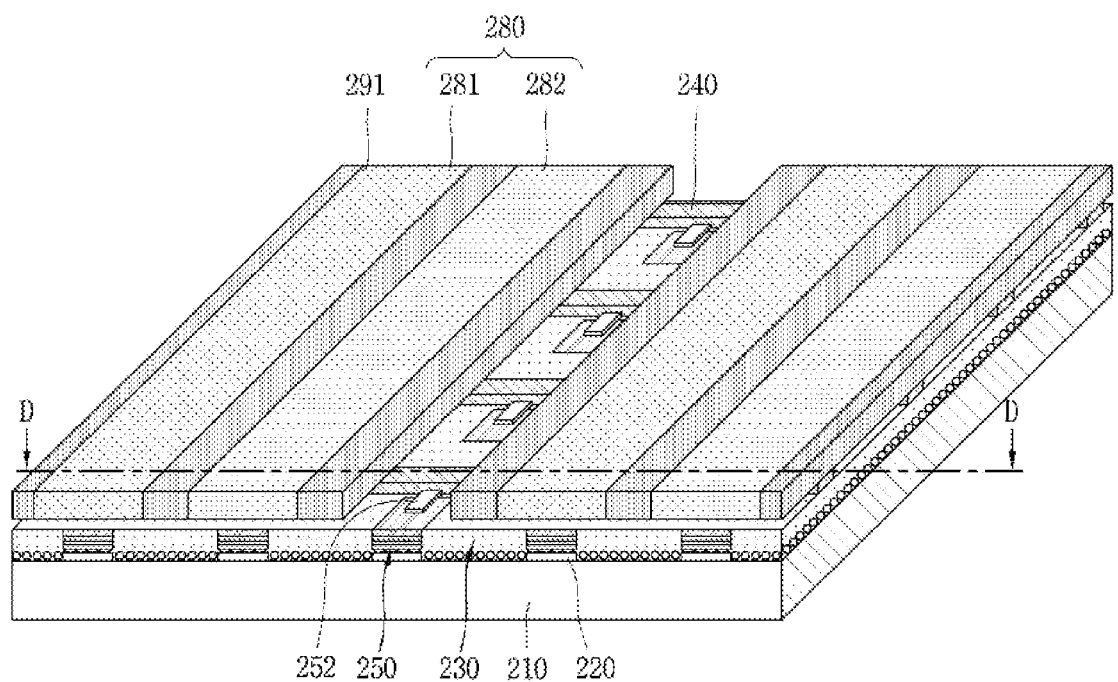

【FIG. 8】
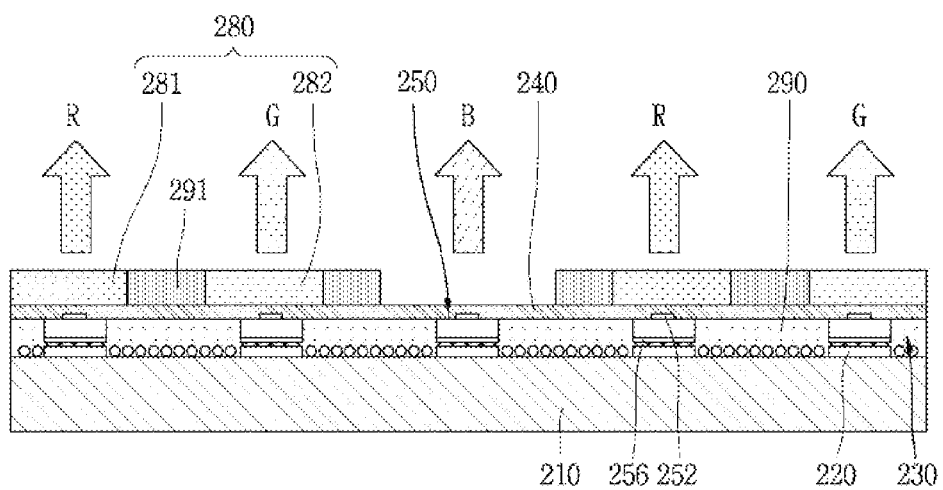
【FIG. 9】
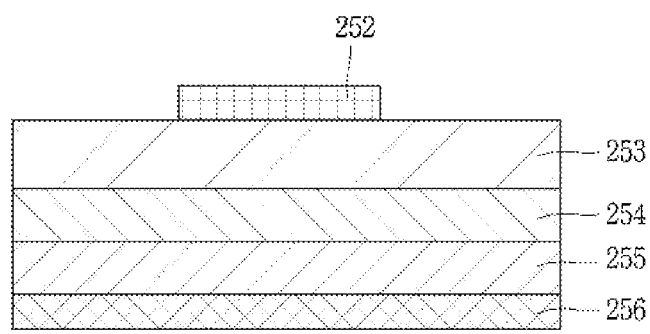

[FIG. 10]
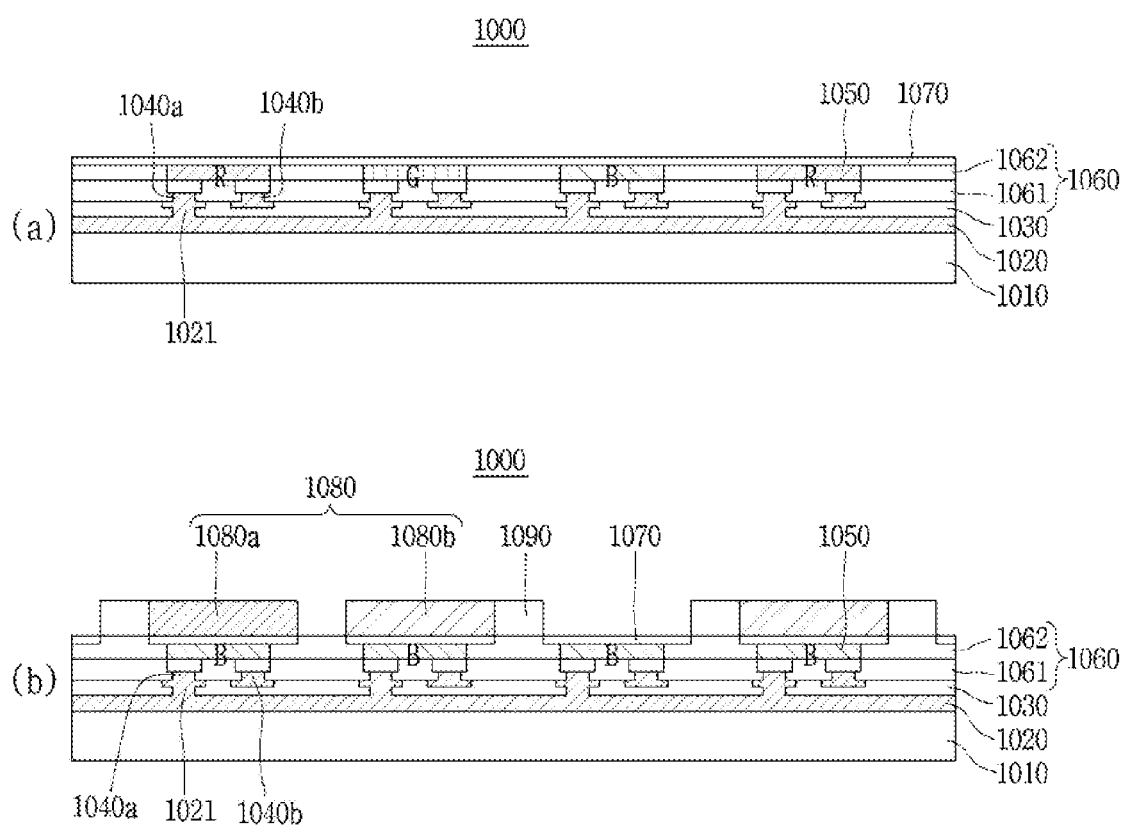

[FIG. 11]
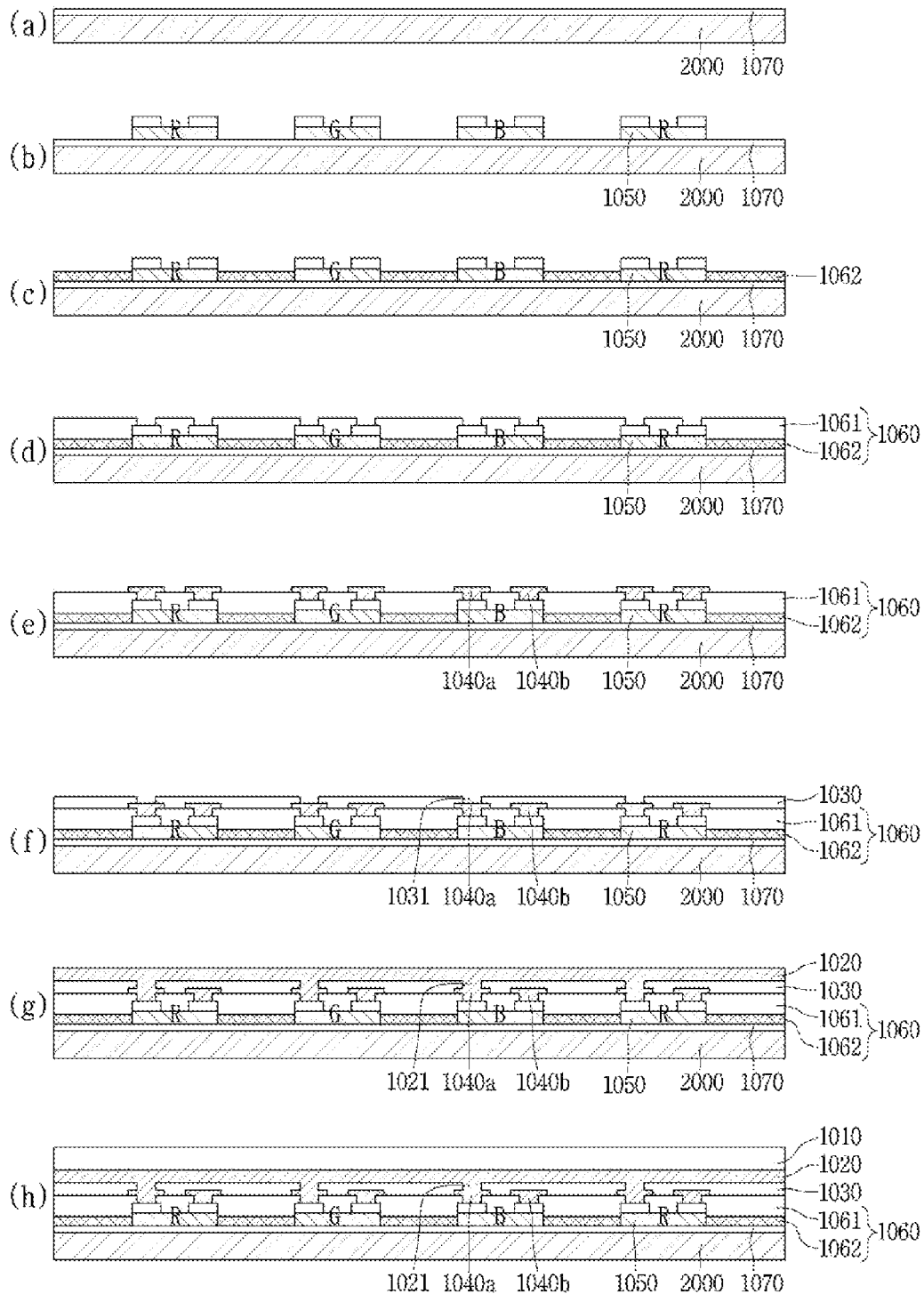

[FIG. 12]
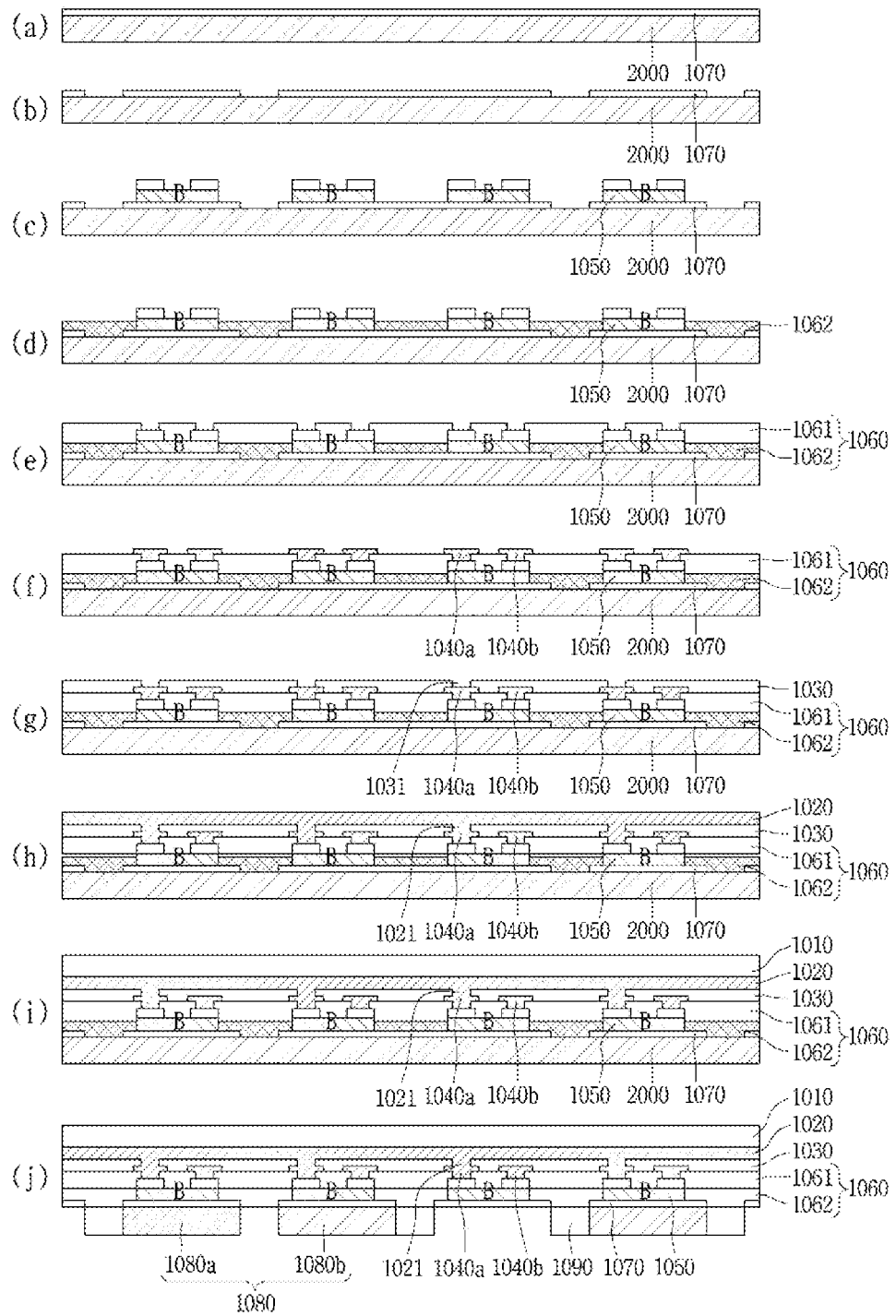

DISPLAY DEVICE USING SEMICONDUCTOR LIGHT-EMITTING ELEMENT, AND MANUFACTURING METHOD THEREFOR

CROSS-REFERENCE TO RELATED APPLICATIONS

This application is the National Stage filing under 35 U.S.C. 371 of International Application No. PCT/KR2019/011277, filed on Sep. 3, 2019, which claims the benefit of earlier filing date and right of priority to Korean Application No. 10-2019-0102625, filed on Aug. 21, 2019, the contents of which are all hereby incorporated by reference herein their entirety.

TECHNICAL FIELD

The present disclosure relates to a display device using a semiconductor light emitting device and a method for manufacturing the same, and more particularly, to a display device using a semiconductor light emitting device having a size of several to tens of μm and a method for manufacturing the same.

BACKGROUND ART

Recently, liquid crystal displays (LCD), organic light emitting device (OLED) displays, micro LED displays, and the like are competing to implement a large-area display in the field of display technology.

However, in the case of LCD, there are problems such as not fast response time and low efficiency of light generated by the backlight and in the case of OLED, there is a weakness in that the lifespan is short, the mass production yield is not good, and the efficiency is low.

On the other hand, when a semiconductor light emitting device (micro LED) having a diameter or cross-sectional area of 100 μm or less is used for a display, there is an advantage in that very high efficiency can be provided because the display does not absorb light using a polarizer or the like.

However, in the case of a large display, since millions of semiconductor light emitting devices are required, it is difficult to secure mass productivity compared to other technologies.

Specifically, in order to provide a large display providing high-resolution image quality, semiconductor light emitting devices have to be arranged at minute intervals. In this case, there is a problem in that the mass production yield is rapidly reduced during an align process for transferring the semiconductor light emitting devices to a substrate and during the wiring process for electrically connecting the semiconductor light emitting devices and the substrate.

DISCLOSURE

Technical Problem

The present disclosure has been devised to solve the above problems, and an object thereof is to provide a display device using a semiconductor light emitting device which is capable of electrically connecting the semiconductor light emitting devices and a wiring substrate by implementing a structure of a wiring substrate directly on a temporary substrate on which semiconductor light emitting devices are arrayed through a stacking process, after transferring semiconductor light emitting devices to the temporary substrate, and a method for manufacturing the same.

Technical Solution

A display device according to the present disclosure may comprise a base part, a first electrode extending in one direction on the base part and comprising protrusions formed at predetermined intervals in the one direction of extending, a first insulating layer stacked on the first electrode and comprising an electrode hole through which the protrusion passes, a first seed electrode formed on the protrusion and connected to the first electrode, a second seed electrode formed on the first insulating layer to be spaced apart from the first seed electrode, semiconductor light emitting devices disposed to contact the first seed electrode and the second seed electrode, and a planarization layer stacked on the first insulating layer and filling a space between the semiconductor light emitting devices, in which the second seed electrode extends in a direction crossing an extension direction of the first electrode.

In the present embodiment, the semiconductor light emitting device may comprise a first conductivity type semiconductor layer on which a first conductivity type electrode is formed, an active layer formed on the first conductivity type semiconductor layer, a second conductivity type semiconductor layer formed on the active layer, and a second conductivity type electrode spaced apart from the first conductivity type electrode in a horizontal direction on the second conductivity type semiconductor layer, in which the first conductivity type electrode and the second conductivity type electrode are respectively connected to one of the first seed electrode and the second seed electrode.

In the present embodiment, the first seed electrode and the second seed electrode may comprise a metal seed layer, and at least one of the first seed electrode and the second seed electrode may further comprise a metal plating layer on the metal seed layer.

In the present embodiment, the planarization layer may comprise a second insulating layer stacked on the first insulating layer and filling at least a space between the first seed electrode and the second seed electrode, and a third insulating layer stacked on the second insulating layer and selectively comprising a black insulator.

In the present embodiment, the display device may further comprise an optical gap layer configured to be disposed on at least the semiconductor light emitting devices and formed of a transparent material.

In the present embodiment, the display device may further comprise a phosphor layer formed along a specific line in which the semiconductor light emitting devices are arranged on the semiconductor light emitting devices to convert a wavelength of light emitted from the semiconductor light emitting devices, and a partition wall part formed between the phosphor layers.

A method for manufacturing a display device according to the present disclosure may comprise transferring the semiconductor light emitting devices on a temporary substrate so that the electrodes face upward, forming a planarization layer filling between the semiconductor light emitting devices on the temporary substrate to expose at least a portion of a top surface of the electrode, alternately forming a first seed electrode and a second seed electrode on the exposed top surface of the electrode, forming a first insulating layer to cover the second seed electrode while forming an electrode hole on the planarization layer to expose at least a portion of a top surface of the first seed electrode, forming a first electrode extending in one direction on the first insulating layer while filling the electrode hole to be connected to the first seed electrode, and forming a base part on the first electrode, in which the first seed electrode is formed in a dot shape, and the second seed electrode is formed in a line shape extending in a direction crossing an extension direction of the first electrode.

In the present embodiment, the semiconductor light emitting device may comprise a first conductivity type semiconductor layer on which a first conductivity type electrode is formed, an active layer formed on the first conductivity type semiconductor layer, a second conductivity type semiconductor layer formed on the active layer, and a second conductivity type electrode spaced apart from the first conductivity type electrode in a horizontal direction on the second conductivity type semiconductor layer, in which the first conductivity type electrode and the second conductivity type electrode are respectively connected to one of the first seed electrode and the second seed electrode.

In the present embodiment, at least one of forming the first seed electrode or the second seed electrode may comprise depositing a metal seed layer to form a seed electrode, and forming a metal plating layer having a predetermined thickness on the metal seed layer.

In the present embodiment, the forming the planarization layer may comprise forming a third insulating layer to a predetermined thickness on the temporary substrate, and forming a second insulating layer on the third insulating layer, in which the second insulating layer fills a space between the first seed electrode and the second seed electrode.

In the present embodiment, the temporary substrate may comprise an optical gap layer formed of a transparent material.

In the present embodiment, in the optical gap layer, a pattern consisting of an intaglio part and an embossed part may be formed on a surface, and the semiconductor light emitting devices may be transferred on the embossed part.

In the present embodiment, the method may further comprise forming a phosphor layer for converting a wavelength of light emitted from the semiconductor light emitting devices along a specific line in which the semiconductor light emitting devices are arranged in a region overlapping the semiconductor light emitting devices, and forming a partition wall part between the phosphor layers.

Advantageous Effect

According to an embodiment of the present disclosure, it is possible to form electrodes electrically connected to the semiconductor light emitting device through a stacking process after transferring the semiconductor light emitting devices, and thus there is an effect which is advantageous for manufacturing a display having a fine pitch and a large area and secures the mass production. In other words, since there is no need to separately go through a wiring process for connecting the electrodes and the semiconductor light emitting devices, which requires high process difficulty and time after the substrate is manufactured, the tack time can be shortened and production efficiency can increase.

DESCRIPTION OF DRAWINGS

FIG. 1 is a conceptual diagram illustrating an embodiment of a display device using a semiconductor light emitting device of the present disclosure.

FIG. 2 is an enlarged view illustrating a portion A of the display device of FIG. 1, and FIGS. 3a and 3b are cross-sectional views taken along lines B-B and C-C of FIG. 2.

FIG. 4 is a conceptual diagram illustrating the flip-chip type semiconductor light emitting device of FIG. 3.

FIGS. 5a to 5c are conceptual views illustrating various forms of implementing colors in relation to a flip-chip type semiconductor light emitting device.

FIG. 6 is a cross-sectional view illustrating a method of manufacturing a display device using a semiconductor light emitting device of the present disclosure.

FIG. 7 is a perspective view illustrating another embodiment of a display device using the semiconductor light emitting device of the present disclosure.

FIG. 8 is a cross-sectional view taken along line D-D of FIG. 7.

FIG. 9 is a conceptual diagram illustrating the vertical semiconductor light emitting device of FIG. 8.

FIG. 10 is a cross-sectional view illustrating a display device (PM method) manufactured by a manufacturing method according to an embodiment of the present disclosure.

FIGS. 11a to 11h are views sequentially illustrating each step of a method for manufacturing a display device comprising R, G, and B semiconductor light emitting devices according to (a) of FIG. 10.

FIGS. 12a to 12j are views sequentially illustrating each step of a method for manufacturing a display device comprising monochromatic (blue) semiconductor light emitting devices according to (b) of FIG. 10.

BEST MODE

Hereinafter, the embodiments disclosed in the present specification will be described in detail with reference to the accompanying drawings, but the same or similar components are assigned the same reference numerals regardless of a drawing number, and overlapping descriptions thereof will be omitted. The suffixes "module" and "part" for the components used in the following description are given or mixed in consideration of only the ease of writing the specification and do not have distinct meanings or roles by themselves. In addition, in describing the embodiments disclosed in the present specification, if it is determined that detailed descriptions of related known technologies may obscure the subject matters of the embodiments disclosed in the present specification, the detailed description thereof will be omitted. In addition, it should be understood that the accompanying drawings are only for easy understanding of the embodiments disclosed in the present specification, and it should not be construed as limiting the technical idea disclosed herein by the accompanying drawings. In addition, when an element, such as a layer, region, or substrate, is referred to as being "on" another component, it may be understood that it is directly on the other element or intervening elements may be present therebetween.

The display device described in this specification comprises a mobile phone, a smart phone, a laptop computer, a digital broadcasting terminal, a personal digital assistant (PDA), a portable multimedia player (PMP), a navigation, a slate PC, a tablet PC, an ultra book, a digital TV, a desktop computer, and the like may be included. However, the configuration according to the embodiment described in this specification can be applied as long as it can comprise a display even in a new product form to be developed later.

FIG. 1 is a conceptual diagram illustrating an embodiment of a display device using a semiconductor light emitting device of the present disclosure.

As illustrated, information processed by the controller of the display apparatus 100 may be displayed on a flexible display. The flexible display comprises a display that can be bent, curved, twisted, folded, or rolled by an external force. For example, the flexible display may be a display manufactured on a thin and flexible substrate that can be bent, curved, folded, or rolled like paper while maintaining the display characteristics of a conventional flat panel display.

In a state where the flexible display is not bent (for example, a state of having an infinite radius of curvature, hereinafter referred to as a 'first state'), the region of the flexible display becomes a flat surface. In a state of being bent by an external force in the first state (for example, a state of having a finite radius of curvature, hereinafter referred to as a 'second state'), the display region may be a curved surface. As illustrated, the information displayed in the second state may be visual information output on the curved surface. Such visual information is implemented by independently controlling the light emission of a sub-pixel disposed in a matrix form. The sub-pixel means a minimum unit for realizing one color.

The sub-pixel of the flexible display may be implemented by a semiconductor light emitting device. In the present disclosure, a light emitting diode (LED) is exemplified as a type of semiconductor light emitting device that converts current into light. The light emitting diode is formed to have a small size, so that it can serve as a sub-pixel even in the second state.

Hereinafter, a flexible display implemented using the light emitting diode will be described in detail with reference to the accompanying drawings.

FIG. 2 is an enlarged view illustrating a portion A of the display device of FIG. 1, and FIGS. 3a and 3b are cross-sectional views taken along lines B-B and C-C of FIG. 2, FIG. 4 is a conceptual diagram illustrating the flip-chip type semiconductor light emitting device of FIG. 3, FIGS. 5a to 5c are conceptual views illustrating various forms of implementing colors in relation to a flip-chip type semiconductor light emitting device.

FIGS. 2, 3a, and 3b illustrate a display device 100 using a passive matrix (PM) type semiconductor light emitting device as the display device 100 using a semiconductor light emitting device. However, the following example is also applicable to an active matrix (AM) type semiconductor light emitting device.

The display device 100 comprises a substrate 110, a first electrode 120, a conductive adhesive layer 130, a second electrode 140, and a plurality of semiconductor light emitting devices 150.

The substrate 110 may be a flexible substrate. The substrate 110 may comprise glass or polyimide (PI) to realize flexible performance. In addition, as a component of the substrate 110, insulating and flexible materials such as polyethylene naphthalate (PEN) and polyethylene terephrhalate (PET) may be used. In addition, the substrate 110 may be any of a transparent material or an opaque material.

The substrate 110 may be a wiring substrate on which the first electrode 120 is disposed, and the first electrode 120 may be located on the substrate 110.

As illustrated, the insulating layer 160 may be formed by being stacked on the substrate 110 on which the first electrode 120 is located, and the auxiliary electrode 170 may be disposed on the insulating layer 160. In this case, a state where the insulating layer 160 is stacked on the substrate 110 may be a single wiring substrate. More specifically, the insulating layer 160 is an insulating and flexible material such as PI, PEN, PET, or the like and is integrally formed with the substrate 110 to form a single wiring substrate.

The auxiliary electrode 170 is an electrode electrically connecting the first electrode 120 and the semiconductor light emitting device 150, and is positioned on the insulating layer 160 and is disposed to correspond to the position of the first electrode 120. For example, the auxiliary electrode 170 may have a dot shape and may be electrically connected to the first electrode 120 by an electrode hole 171 penetrating the insulating layer 160. The electrode hole 171 may be formed by filling the via hole with a conductive material.

According to the accompanying drawings, the conductive adhesive layer 130 is formed on one surface of the insulating layer 160, but the present disclosure is not necessarily limited thereto. For example, a layer performing a specific function may be formed between the insulating layer 160 and the conductive adhesive layer 130, and a structure in which the conductive adhesive layer 130 is disposed on a substrate without the insulating layer 160 is also possible. In a structure in which the conductive adhesive layer 130 is disposed on a substrate, the conductive adhesive layer 130 may serve as an insulating layer.

The conductive adhesive layer 130 may be a layer having adhesiveness and conductivity, and for this purpose, the conductive adhesive layer 130 may be formed by mixing a conductive material and an adhesive material. In addition, the conductive adhesive layer 130 has ductility, thereby enabling a flexible function in the display device.

For example, the conductive adhesive layer 130 may be an anisotropy conductive film (ACF), an anisotropic conductive paste, a solution containing conductive particles, or the like. The conductive adhesive layer 130 allows electrical interconnection in the z-direction passing through the thickness but may be configured as an electrically insulating layer in the horizontal x-y direction. Accordingly, the conductive adhesive layer 130 may be referred to as a z-axis conductive layer (however, hereinafter, it is referred to as a 'conductive adhesive layer').

The anisotropic conductive film is a film in which an anisotropic conductive medium is mixed with an insulating base member, and when heat and pressure are applied, the anisotropic conductive film has conductivity due to anisotropic conduction medium limited to a specific part. In this specification, it is described that heat and pressure are applied to the anisotropic conductive film, but in order for the anisotropic conductive film to have partial conductivity, another method (for example, only one of heat and pressure is applied or UV curing method) can also be used.

In addition, the anisotropic conductive medium may be a conductive ball or conductive particles. As illustrated, the anisotropic conductive film is a film in which conductive balls are mixed with an insulating base member, and when heat and pressure are applied, only a specific portion thereof has conductivity due to the conductive ball. The anisotropic conductive film may be in a state where particles having a shape in which the core of the conductive material is coated with an insulating film made of a polymer material is contained, in this case, the anisotropic conductive film has conductivity by the core while the insulating film of the particles contained in the portion to which heat and pressure is applied is destroyed. At this time, the shape of the core may be deformed to form a layer in contact with each other in the thickness direction of the film. More specifically, heat and pressure are applied as a whole to the anisotropic conductive film, and electrical connection in the z-axis direction may be partially formed due to a height difference of a counterpart adhered by the anisotropic conductive film.

As another example, the anisotropic conductive film may be in a state where a plurality of particles coated with a conductive material is contained in an insulating core. In this case, while the conductive material in the portion to which heat and pressure is applied is deformed (stuck), the anisotropic conductive film has conductivity in the thickness direction of the film. As another example, a form in which the conductive material penetrates the insulating base member in the z-axis direction to have conductivity in the thickness direction of the film is also possible. In this case, the conductive material may have a pointed end portion.

As illustrated, the anisotropic conductive film may be a fixed array anisotropic conductive film (fixed array ACF) configured as a form in which conductive balls are inserted into one surface of the insulating base member. The insulating base member is formed of a material having an adhesive property, and the conductive balls are intensively disposed on the bottom portion of the insulating base member so that when heat and pressure are applied from the base member, the base member is deformed together with the conductive ball to have conductivity in the vertical direction.

However, the present disclosure is not necessarily limited thereto, and the anisotropic conductive film can have all a form in which conductive balls are randomly mixed with an insulating base member, a form which is composed of a plurality of layers and in which conductive balls are disposed on one layer (double ACF), and the like.

The anisotropic conductive paste is a combination of paste and conductive balls and may be a paste in which conductive balls are mixed with an insulating and adhesive base material. In addition, the solution containing conductive particles may be a solution containing conductive particles or nanoparticles.

Referring to the accompanying drawings, the second electrode 140 is spaced apart from the auxiliary electrode 170 and is positioned on the insulating layer 160. In other words, the conductive adhesive layer 130 is disposed on the insulating layer 160 in which the auxiliary electrode 170 and the second electrode 140 are located.

After the conductive adhesive layer 130 is formed in a state where the auxiliary electrode 170 and the second electrode 140 are positioned on the insulating layer 160, when heat and pressure are applied to connect the semiconductor light emitting device 150 in a flip-chip form, the semiconductor light emitting device 150 is electrically connected to the first electrode 120 and the second electrode 140.

The semiconductor light emitting device 150 may be a flip chip type light emitting device as illustrated in FIG. 4.

For example, the semiconductor light emitting device 150 comprises a p-type electrode 156, a p-type semiconductor layer 155 on which the p-type electrode 156 is formed, and an active layer 154 formed on the p-type semiconductor layer 155, an n-type semiconductor layer 153 formed on the active layer 154 and an n-type electrode 152 spaced apart from the p-type electrode 156 in the horizontal direction on the n-type semiconductor layer 153. In this case, the p-type electrode 156 may be electrically connected to the auxiliary electrode 170 by the conductive adhesive layer 130, and the n-type electrode 152 may be electrically connected to the second electrode 140.

Referring to FIGS. 2, 3a, and 3b, the auxiliary electrode 170 is formed to be elongated in one direction so that one auxiliary electrode 170 may be electrically connected to the plurality of semiconductor light emitting devices 150. For example, the p-type electrodes 156 of the semiconductor light emitting devices 150 on the left and right with the auxiliary electrode 170 as the center may be electrically connected to one auxiliary electrode 170.

Specifically, the semiconductor light emitting device 150 is press-fitted into the conductive adhesive layer 130 by heat and pressure, and through this, a portion between the p-type electrode 156 and the auxiliary electrode 170 of the semiconductor light emitting device 150, and only the portion between the n-type electrode 152 and the second electrode 140 of the semiconductor light emitting device 150 has conductivity, and there is no press-fitting of the semiconductor light emitting device 150 in the remaining portion, so that the remaining portion does not have conductivity. As such, the conductive adhesive layer 130 may electrically connect as well as mutually couple between the semiconductor light emitting device 150 and the auxiliary electrode 170 and between the semiconductor light emitting device 150 and the second electrode 140.

In addition, the plurality of semiconductor light emitting devices 150 constitute a light emitting device array, and a phosphor layer 180 is formed on the light emitting device array. The light emitting device array may comprise a plurality of light emitting devices 150 having different luminance values. Each semiconductor light emitting device 150 constitutes a sub-pixel and is electrically connected to the first electrode 120. For example, there may be a plurality of first electrodes 120, the semiconductor light emitting devices 150 are disposed in several rows, and the semiconductor light emitting devices 150 in each row may be electrically connected to any one of the plurality of first electrodes 120.

In addition, since the semiconductor light emitting devices 150 are connected in a flip-chip form, the semiconductor light emitting devices 150 grown on a transparent dielectric substrate may be used. The semiconductor light emitting devices 150 may be, for example, nitride semiconductor light emitting devices. Since the semiconductor light emitting device 150 has excellent luminance and can configure individual sub-pixels even with a small size.

Referring to the drawings, a partition wall 190 may be formed between the semiconductor light emitting devices 150. In this case, the partition wall 190 may serve to separate individual sub-pixels from each other and may be integrally formed with the conductive adhesive layer 130. For example, by inserting the semiconductor light emitting device 150 into the anisotropic conductive film, the base member of the anisotropic conductive film may form the partition wall 190.

In addition, when the base member of the anisotropic conductive film is black, the partition wall 190 may have reflective properties and increase contrast even without a separate black insulator.

As another example, a separate reflective partition wall may be provided as the partition wall 190. In this case, the partition wall 190 may comprise a black or white insulator according to the purpose of the display device. In a case where the partition wall 190 made of a white insulator is used, it is possible to increase reflectivity, and in a case where the partition wall 190 made of a black insulator is used, it is possible to have reflective properties and increase the contrast.

The phosphor layer 180 may be located on the outer surface of the semiconductor light emitting device 150. For example, in a case where the semiconductor light emitting device 150 is a blue semiconductor light emitting device emitting blue (B) light, the phosphor layer 180 can perform a function of converting the blue (B) light into the color of a sub-pixel. The phosphor layer 180 may be a red phosphor 181 or a green phosphor 182 constituting an individual pixel.

In other words, a red phosphor 181 capable of converting blue (B) light into red (R) light may be stacked on the blue semiconductor light emitting device 151 at a position constituting a red sub-pixel, and a green phosphor 182 capable of converting blue (B) light into green (G) light may be stacked on the blue semiconductor light emitting device 151 at a position constituting a green sub-pixel. In addition, only the blue semiconductor light emitting device 151 may be used alone in the portion constituting the blue sub-pixel. In this case, sub-pixels of red (R), green (G), and blue (B) may form one pixel. Specifically, the phosphor 180 of one color may be stacked along each line of the first electrode 120, and thus, one line in the first electrode 120 may be an electrode that controls one color. In other words, red (R), green (G), and blue (B) may be sequentially disposed along the second electrode 140, and a sub-pixel may be implemented.

However, the present disclosure is not necessarily limited thereto, and instead of the phosphor 180, the semiconductor light emitting device 150 and the quantum dot (QD) are combined and thus can implement red (R), green (G), and blue (B).

In addition, a black matrix 191 may be disposed between each of the phosphor layers 180 to improve contrast between light and dark.

However, the present disclosure is not necessarily limited thereto, and other structures for implementing blue, red, and green colors may be applied.

Referring to FIG. 5a, each semiconductor light emitting device 150 mainly uses gallium nitride (GaN), indium (In) and/or aluminum (Al) are added together and thus can be implemented as a light emitting device of a large output emitting light of various colors comprising blue.

In this case, the semiconductor light emitting device 150 may be provided as red, green, and blue semiconductor light emitting devices to form each sub-pixel. For example, red, green, and blue semiconductor light emitting devices R, G, and B are alternately disposed, and sub-pixels of red, green, and blue colors are formed as one pixel by the red, green and blue semiconductor light emitting devices, and through this, a full-color display can be implemented. Referring to FIG. 5b, the semiconductor light emitting device 150 may be a white light emitting device W in which a yellow phosphor layer is provided for each individual element. In this case, a red phosphor layer 181, a green phosphor layer 182, and a blue phosphor layer 183 may be provided on the white light emitting device W to form a sub-pixel. In addition, a sub-pixel may be formed on the white light emitting device W by using a color filter in which red, green, and blue are repeated.

Referring to FIG. 5c, a red phosphor layer 181, a green phosphor layer 182, and a blue phosphor layer 183 may be provided on the ultraviolet light emitting device UV. As such, the semiconductor light emitting device 150 can be used in the entire region comprising the ultraviolet region as well as the visible ray region and can be extended in the form of a semiconductor light emitting device in which ultraviolet rays can be used as an excitation source of the upper phosphor.

Referring back to this example, the semiconductor light emitting device 150 is positioned on the conductive adhesive layer 130 to constitute a sub-pixel in the display device. Since the semiconductor light emitting device 150 has excellent luminance, individual sub-pixels can be configured even with a small size. The size of the individual semiconductor light emitting device 150 may be a rectangular or square element having a side length of 80 μm or less. In the case of a rectangular shape, the size may be 20×80 μm or less.

In addition, even when the square semiconductor light emitting device 150 having a side length of 10 μm is used as a sub-pixel, sufficient brightness to form a display device can be implemented. Therefore, for example, in a case where the size of the sub-pixel is a rectangular pixel having one side of 600 μm and the other side of 300 μm, the distance of the semiconductor light emitting device 150 is relatively large enough to realize a flexible display device of HD quality.

The display device using the semiconductor light emitting device described above can be manufactured by a new type of manufacturing method and hereinafter, the manufacturing method will be described with reference to FIG. 6.

Referring to FIG. 6, first, a conductive adhesive layer 130 is formed on the insulating layer 160 on which the auxiliary electrode 170 and the second electrode 140 are positioned. An insulating layer 160 is stacked on the first substrate 110 to form one substrate (or wiring substrate), and the wiring substrate comprises a first electrode 120, an auxiliary electrode 170, and a second electrode 140. The first electrode 120 and the second electrode 150 may be disposed in a direction perpendicular to each other. In addition, in order to implement a flexible display device, the first substrate 110 and the insulating layer 160 may each comprise glass or polyimide (PO).

The conductive adhesive layer 130 may be implemented by an anisotropic conductive film, and for this purpose, the anisotropic conductive film may be applied to a substrate positioned on the insulating layer 160.

Next, a second substrate 112 on which a plurality of semiconductor light emitting devices 150 corresponding to the positions of the auxiliary electrode 170 and the second electrodes 140 and constituting individual pixels are located is disposed so that the semiconductor light emitting device 150 faces the auxiliary electrode 170 and the second electrode 140.

In this case, the second substrate 112 is a growth substrate on which the semiconductor light emitting device 150 is grown and may be a sapphire substrate or a silicon substrate.

The semiconductor light emitting device 150 can be effectively used in a display device by having an interval and a size that can form a display device when formed in a wafer unit.

Next, the wiring substrate and the second substrate 112 are thermocompression-bonded. For example, the wiring substrate and the second substrate 112 may be thermocompression-bonded by applying an ACF press head. The wiring substrate and the second substrate 112 are bonded by the thermocompression bonding. Due to the properties of the anisotropic conductive film having conductivity by thermocompression bonding, only the portion between the semiconductor light emitting device 150 and the auxiliary electrode 170 and the second electrode 140 has conductivity and the electrodes can be electrically connected to the semiconductor light emitting device 150. At this time, the semiconductor light emitting device 150 is inserted into the anisotropic conductive film, and through this, a partition wall may be formed between the semiconductor light emitting device 150.

Next, the second substrate 112 is removed. For example, the second substrate 112 may be removed using a laser lift-off (LLO) method or a chemical lift-off (CLO) method.

Finally, the second substrate 112 is removed to expose the semiconductor light emitting device 150 to the outside. If necessary, a transparent insulating layer (not illustrated) may be formed by coating the wiring substrate to which the semiconductor light emitting device 150 is coupled with silicon oxide (SiOx) or the like.

In addition, the method may further comprise forming a phosphor layer on one surface of the semiconductor light emitting device 150. For example, the semiconductor light emitting device 150 is a blue semiconductor light emitting device that emits blue (B) light, and a red phosphor or a green phosphor for converting the blue (B) light into the color of the sub-pixel may form a layer on one surface of the blue semiconductor light emitting device.

The manufacturing method or structure of the display device using the semiconductor light emitting device described above may be modified and implemented in various forms. For example, the vertical semiconductor light emitting device may be applied to the display device described above. Hereinafter, a vertical structure will be described with reference to FIGS. 5 and 6.

In addition, in the modified examples or embodiments described below, the same or similar reference numerals are assigned to the same or similar structures as the previous examples, and the description thereof refers to the description described above.

FIG. 7 is a perspective view illustrating another embodiment of a display device using the semiconductor light emitting device of the present disclosure, FIG. 8 is a cross-sectional view taken along line D-D of FIG. 7, and FIG. 9 is a conceptual diagram illustrating the vertical semiconductor light emitting device of FIG. 8.

Referring to the drawings, the display device may be a display device using a passive matrix (PM) type vertical semiconductor light emitting device.

The display device comprises a substrate 210, a first electrode 220, a conductive adhesive layer 230, a second electrode 240, and a plurality of semiconductor light emitting devices 250.

The substrate 210 is a wiring substrate on which the first electrode 220 is disposed and may comprise polyimide (PI) to implement a flexible display device and in addition, any insulating and flexible material may be used.

The first electrode 220 is positioned on the substrate 210 and may be formed as a bar-shaped electrode long in one direction. The first electrode 220 may serve as a data electrode.

The conductive adhesive layer 230 is formed on the substrate 210 on which the first electrode 220 is positioned. Like a display device to which a flip chip type light emitting device is applied, the conductive adhesive layer 230 may be an anisotropic conductive film (ACF), an anisotropic conductive paste, a solution containing conductive particles, or the like. However, in this embodiment as well, a case where the conductive adhesive layer 230 is implemented by an anisotropic conductive film is exemplified.

When the semiconductor light emitting device 250 is connected by applying heat and pressure after positioning the anisotropic conductive film in a state where the first electrode 220 is positioned on the substrate 210, the semiconductor light emitting device 250 is electrically connected to the first electrode 220. In this case, the semiconductor light emitting device 250 is preferably disposed to be positioned on the first electrode 220.

The electrical connection is created because, as described above, when heat and pressure are applied to the anisotropic conductive film, the anisotropic conductive film has partial conductivity in the thickness direction. Accordingly, the anisotropic conductive film is divided into a conductive portion 231 and a non-conductive portion 232 in the thickness direction.

In addition, since the anisotropic conductive film contains an adhesive component, the conductive adhesive layer 230 implements not only electrical connection but also mechanical bonding between the semiconductor light emitting device 250 and the first electrode 220.

As such, the semiconductor light emitting device 150 is positioned on the conductive adhesive layer 130 to constitute a sub-pixel in the display device. Since the semiconductor light emitting device 150 has excellent luminance, individual sub-pixels can be configured even with a small size. The size of the individual semiconductor light emitting device 150 may be a rectangular or square element having a side length of 80 μm or less. In the case of a rectangular shape, the size may be 20×80 μm or less.

The semiconductor light emitting device 250 may have a vertical structure.

A plurality of second electrodes 240 which are disposed in a direction crossing the longitudinal direction of the first electrode 220 and electrically connected to the vertical semiconductor light emitting devices 250, respectively are located between the vertical semiconductor light emitting devices 250.

Referring to FIG. 9, the vertical semiconductor light emitting device comprises a p-type electrode 256, a p-type semiconductor layer 255 formed on the p-type electrode 256, and an active layer 254 formed on the p-type semiconductor layer 255, a n-type semiconductor layer 253 formed on the active layer 254, and an n-type electrode 252 formed on the n-type semiconductor layer 253. In this case, the p-type electrode 256 located on the lower part may be electrically connected to the first electrode 220 by the conductive adhesive layer 230, and the n-type electrode 252 located on the upper part may be electrically connected to a second electrode 240 to be described later. The vertical semiconductor light emitting device 250 has a great advantage in that the size of the chip can be reduced because electrodes can be disposed up and down.

Referring to FIG. 8, a phosphor layer 280 may be formed on one surface of the semiconductor light emitting device 250. For example, the semiconductor light emitting device 250 is a blue semiconductor light emitting device 251 emitting blue (B) light, and a phosphor layer 280 for converting the blue (B) light into a color of a sub-pixel may be provided. In this case, the phosphor layer 280 may be a red phosphor 281 and a green phosphor 282 constituting individual pixels.

In other words, a red phosphor 281 capable of converting blue (B) light into red (R) light may be stacked on the blue semiconductor light emitting device 251 at a position constituting a red sub-pixel, and a green phosphor 282 capable of converting blue (B) light into green (G) light may be stacked on the blue semiconductor light emitting device 251 at a position constituting a green sub-pixel. In addition, the blue semiconductor light emitting device 251 may be used alone in the portion constituting the blue sub-pixel. In this case, sub-pixels of red (R), green (G), and blue (B) may form one pixel.

However, the present disclosure is not necessarily limited thereto, and as described above in a display device to which a flip chip type light emitting device is applied, other structures for realizing blue, red, and green colors may be applied.

In this embodiment, the second electrode 240 is positioned between the semiconductor light emitting devices 250 and is electrically connected to the semiconductor light emitting devices 250. For example, the semiconductor light emitting devices 250 may be arranged in a plurality of rows, and the second electrode 240 may be positioned between the rows of the semiconductor light emitting devices 250.

Since the distance between the semiconductor light emitting devices 250 constituting individual pixels is sufficiently large, the second electrode 240 may be positioned between the semiconductor light emitting devices 250.

The second electrode 240 may be formed as a long bar-shaped electrode in one direction and may be disposed in a direction perpendicular to the first electrode 220.

In addition, the second electrode 240 and the semiconductor light emitting device 250 may be electrically connected to each other by an electrode protruding from the second electrode 240. Specifically, the connection electrode may be the n-type electrode 252 of the semiconductor light emitting device 250. For example, the n-type electrode 252 is formed as an ohmic electrode for ohmic contact, and the second electrode 240 covers at least a portion of the ohmic electrode by printing or deposition. Through this, the second electrode 240 and the n-type electrode 252 of the semiconductor light emitting device 250 may be electrically connected.

As illustrated, the second electrode 240 may be positioned on the conductive adhesive layer 230, and, if necessary, a transparent insulating layer (not illustrated) comprising silicon oxide (SiOx) and the like may be formed on the substrate 210 on which the semiconductor light emitting device 250 is formed. In a case where the second electrode 240 is positioned after forming the transparent insulating layer, the second electrode 240 is positioned on the transparent insulating layer. In addition, the second electrode 240 may be formed to be spaced apart from the conductive adhesive layer 230 or the transparent insulating layer.

In a case where a transparent electrode such as indium tin oxide (ITO) is used to position the second electrode 240 on the semiconductor light emitting device 250, there is a problem that the ITO material has poor adhesion to the n-type semiconductor layer 253. Accordingly, the present disclosure has an advantage in that it does not need to use a transparent electrode such as ITO by locating the second electrode 240 between the semiconductor light emitting devices 250. Therefore, it is possible to improve light extraction efficiency by using a conductive material having good adhesion to the n-type semiconductor layer 253 as a horizontal electrode without being constrained by the selection of a transparent material.

Referring to the drawings, a partition wall 290 may be positioned between the semiconductor light emitting devices 250. A partition wall 290 may be disposed between the vertical semiconductor light emitting devices 250 to isolate the semiconductor light emitting devices 250 constituting individual pixels. In this case, the partition wall 290 may serve to separate individual sub-pixels from each other and may be integrally formed with the conductive adhesive layer 230. For example, by inserting the semiconductor light emitting device 250 into the anisotropic conductive film, the base member of the anisotropic conductive film may form the partition wall 290.

In addition, when the base member of the anisotropic conductive film is black, the partition wall 290 may have reflective properties and a contrast may be increased even without a separate black insulator.

As another example, the partition wall 290 may be separately provided with a reflective partition wall. The partition wall 290 may comprise a black or white insulator according to the purpose of the display device.

If the second electrode 240 is directly positioned on the conductive adhesive layer 230 between the semiconductor light emitting devices 250, the partition wall 290 may be located between the vertical semiconductor light emitting device 250 and the second electrode 240. Accordingly, individual sub-pixels can be configured even with a small size by using the semiconductor light emitting device 250, and the distance of the semiconductor light emitting devices 250 is relatively large enough to locate the second electrode 240 between the semiconductor light emitting devices 250, and thus there is an effect that a flexible display device of HD quality can be obtained.

In addition, a black matrix 291 may be disposed between respective phosphors in order to improve contrast of light and dark.

As described above, the semiconductor light emitting device 250 is positioned on the conductive adhesive layer 230 and constitutes individual pixels in the display device through this. Since the semiconductor light emitting device 250 has excellent luminance, individual sub-pixels can be configured even with a small size. Accordingly, a full-color display in which sub-pixels of red (R), green (G), and blue (B) constitute one pixel can be implemented by the semiconductor light emitting device 250.

Meanwhile, according to the conventional method of manufacturing a display apparatus comprising the method for manufacturing the display apparatus described above, the semiconductor light emitting devices 150 and 250 grown on the growth substrate 112 are transferred to the wiring substrate 110, and then a process of electrically connecting the semiconductor light emitting devices 150 and 250 to the electrodes (the first electrode 120, the auxiliary electrode 170, and the second electrode 160) formed on the wiring substrate 110 is performed.

Specifically, a method of transferring the semiconductor light emitting devices 150 and 250 to the wiring substrate 110 comprises a laser lift-off method (LLO), a method using a transfer stamp, or the like and it is also possible to selectively transfer the semiconductor light emitting devices 150 and 250 to the wiring substrate 110 by these methods.

In addition, the semiconductor light emitting devices 150 and 250 transferred to the wiring substrate 110 are electrically connected to electrodes formed on the wiring substrate 110 through bonding or sputtering. For example, the bonding method comprises an anisotropic conductive film (ACF), an anisotropic conductive paste (ACP), a method using metal solder, and the like.

However, in a case of manufacturing a large-area high-definition display device comprising the semiconductor light emitting devices 150 and 250 having a size of several to several tens of μm, at least millions of semiconductor light emitting devices 150 and 250 should be arranged in a fine pitch on the wiring substrate 110, there is a problem in that the mass production yield is rapidly lowered, in order to transfer the semiconductor light emitting devices 150 and 250 to a preset position on the wiring substrate 110, while a step of aligning the semiconductor light emitting devices 150 and 250 with preset positions on the wiring substrate 110 and a step of electrically connecting the semiconductor light emitting devices 150 and 250 aligned on the wiring substrate 110 to the electrodes 120, 160, and 170 formed on the wiring substrate 110 are performed, respectively.

Accordingly, the present disclosure proposes a new method for manufacturing a display device in which semiconductor light emitting devices are transferred onto a temporary substrate and then the structure of a wiring substrate is directly implemented on a temporary substrate on which semiconductor light emitting devices are arranged through a stacking process.

Hereinafter, a method for manufacturing a display device using a semiconductor light emitting device according to the present disclosure will be described in detail with reference to the accompanying drawings.

FIG. 10 is a cross-sectional view illustrating a display device (PM method) manufactured by a manufacturing method according to an embodiment of the present disclosure, FIGS. 11a to 11h are views sequentially illustrating each step of a method for manufacturing a display device comprising R, G, and B semiconductor light emitting devices according to (a) of FIG. 10, and FIGS. 12a to 12j are views sequentially illustrating each step of a method for manufacturing a display device comprising monochromatic (blue) semiconductor light emitting devices according to (b) of FIG. 10.

In this specification, the display apparatus 1000 using a passive matrix (PM) type semiconductor light emitting device is exemplified. However, the following example is also applicable to an active matrix (AM) type semiconductor light emitting device.

The display device 1000 according to an embodiment of the present disclosure has a structure in which a base part 1010, a first electrode 1020, a first insulating layer 1030, a first seed electrode 1040a and a second seed electrode 1040b, planarization layers 1060 may be sequentially stacked. The semiconductor light emitting devices 1050 constituting the display apparatus 1000 may be formed of only blue (B) semiconductor light emitting devices or blue (B), green (G), and red (R) semiconductor light emitting devices. In the former case, the display device 1000 may have a structure in which the phosphor layer 1080 and the partition wall part 1090 are further stacked (see (a) of FIG. 10 and (b) of FIG. 10).

The base part 1010 has flexible performance, and for this purpose, polyimide (PI) or glass may comprise, or an insulating and flexible material such as polyethylene naphthalate (PEN) or polyethylene terephthalate (PET) may be used. In addition, the base part 1010 may be any of a transparent material or an opaque material.

A first electrode 1020 may be disposed on the base part 1010. The first electrode 1020 is formed to extend along one direction on the base part 1010 and may comprise protrusions 1021 formed at predetermined intervals in the extension direction. The protrusion 1021 may protrude in the stacking direction.

A first insulating layer 1030 may be disposed on the first electrode 1020. The first insulating layer 1030 may be stacked on the first electrode 1020 while forming an electrode hole 1031 through which the protrusion 1021 passes. In order to realize flexible performance, the first insulating layer 1030 may be formed of an insulating and flexible material such as polyimide (PI), PEN, and PET.

The protrusion 1021 passing through the electrode hole 1031 is a part of the first electrode 1020 formed of the same material as the first electrode 1020 or may be formed of another material having conductivity that can electrically connect the first electrode 1020 and an electrode of the semiconductor light emitting device 1050. In addition, one surface of the protrusion 1021 passing through the electrode hole 1031 may be exposed on the first insulating layer 1030.

A seed electrode 1040 may be disposed on the first insulating layer 1030. The seed electrode 1040 may comprise a first seed electrode 1040a formed on the protrusion 1021 exposed on the first insulating layer 1030 and a second seed electrode 1040b formed on the first insulating layer 1040b and formed to be spaced apart from the first seed electrode 1040a.

The first seed electrode 1040a and the second seed electrode 1040b may be electrically connected to the semiconductor light emitting devices 1050. In other words, the semiconductor light emitting devices 1050 may be disposed to contact the first seed electrodes 1040a and second seed electrodes 1040b. At this time, since the first seed electrode 1040a and the second seed electrode 1040b are positioned in the same direction, as the semiconductor light emitting device 1050, a flip chip type semiconductor light emitting device 1050 (see FIG. 4) on which an electrode is formed in the same direction may be used.

The flip chip type semiconductor light emitting device 1050 may comprise a first conductivity type semiconductor layer (155 in FIG. 4) on which a first conductivity type electrode (156 in FIG. 4) is formed, an active layer (154 in FIG. 4) formed on the first conductivity type semiconductor layer (155 in FIG. 4), a second conductivity type semiconductor layer (153 in FIG. 4) formed on the active layer (154 in FIG. 4), and a second conductivity type electrode (152 in FIG. 4) disposed to be spaced apart from the first conductivity type electrode (156 in FIG. 4) in the horizontal direction on the second conductivity type semiconductor layer (153 in FIG. 4).

The first conductivity type electrode (156 in FIG. 4) and the second conductivity type electrode (152 in FIG. 4) may be a p-type electrode or an n-type electrode and can be connected to any one of the first seed electrode 1040a and the second seed electrode 1040b, respectively. In other words, the interval between the first seed electrode 1040a and the second seed electrode 1040b is the same as or very similar to the interval between the first conductivity type electrode (156 in FIG. 4) and the second conductivity type electrode (152 in FIG. 4).

Meanwhile, the first seed electrode 1040a is formed in a dot shape, is connected to the first electrode 1020 through the protrusion 1021, and thus may connect a semiconductor light emitting devices 1050 arranged along the extension direction of the first electrode 1020. On the other hand, the second seed electrode 1040b is in the form of a line extending in a direction crossing the extension direction of the first electrode 1020 and may connect the semiconductor light emitting devices 1050 arranged in the corresponding direction.

In summary, the semiconductor light emitting devices 1050 are arranged in a matrix form consisting of a plurality of rows and columns, for example, the first electrode 1020 extends in the row direction and connects semiconductor light emitting devices 1050 arranged in the row direction, and the second seed electrode 1040b may extend in a row direction crossing the first electrode 1020 to connect the semiconductor light emitting devices 1050 arranged in the row direction. In addition, under this structure, the first electrode 1020 may serve as a data electrode, and the second seed electrode 1040b may serve as a scan electrode.

Meanwhile, the first seed electrode 1040a and the second seed electrode 1040b comprise a metal seed layer, and at least one of the first seed electrode 1040a and the second seed electrode 1040b may further comprise a metal plating layer formed on the metal seed layer. The metal seed layer may be a metal thin film layer formed to a thin thickness by deposition, and the metal plating layer may be a layer which is formed to a sufficient thickness on the metal seed layer by an electroplating method in which a voltage is applied to the metal seed layer (layer to be plated) and the plated metal. The seed electrode 1040 comprising the metal plating layer may secure a larger amount of current due to the thickness of the seed electrode.

A planarization layer 1060 filling between the semiconductor light emitting devices 1050 may be disposed on the first insulating layer 1030. The planarization layer 1060 may be formed of an insulating material (for example, an inorganic material such as $SiO_2$, $SiN_x$, SiON, $Al_2O_3$, $TiO_2$, $HfO_2$, or the like) and may have a single-layer structure or a multi-layer structure comprising two or more layers.

For example, in the latter case, the planarization layer 1060 may comprise a second insulating layer 1061 disposed on the first insulating layer 1030 and a third insulating layer 1062 stacked on the second insulating layer 1061. The second insulating layer 1061 may be formed on the first insulating layer 1030 to a thickness sufficient to fill at least a space between the first seed electrodes 1040a and the second seed electrodes 1040b. The third insulating layer 1062 may be formed on the second insulating layer 1061 while filling between the semiconductor light emitting devices 1050 and is formed by the same height as that of at least the first conductivity type semiconductor layer (155 of FIG. 4) of the semiconductor light emitting devices 1050 so that one surface of the corresponding layer can have a planarized shape.

The second insulating layer 1061 and the third insulating layer 1062 may be formed of the same material or different materials from each other and the third insulating layer 1062 may optionally comprise a black insulator. In a case where the third insulating layer 1062 comprises a black insulator, there is an effect that a contrast is improved.

The display device 1000 may comprise an optical gap layer 1070 formed of a transparent material. The optical gap layer 1070 may be entirely disposed on one surface planarized by the planarization layer 1060 or may be patterned and thus disposed on at least the semiconductor light emitting devices 1050. The optical gap layer 1070 may be formed of a transparent material (for example, epoxy, acryl-based silicone) having light transmittance and adhesiveness and has an effect of improving the light efficiency of the display device 1000.

In addition, in a case where the display device 1000 is formed of only the semiconductor light emitting devices 1050 that emit light of a single color (for example, only the blue (B) semiconductor light emitting devices 1050 are formed), the phosphor layer 1080 and a partition wall part 1090 may be further included. The phosphor layer 1080 is formed along a specific line in which the semiconductor light emitting devices 1050 are arranged on the semiconductor light emitting devices 1050, so that the wavelength of blue light emitted from the semiconductor light emitting devices 1050 is converted into the wavelength region of green or red light.

The specific line on which the phosphor layer 1080 is formed may be a line corresponding to a green or red individual pixel region. For example, the phosphor layer 1080 formed along the line corresponding to the green individual pixel region may be the green phosphor layer 1080b comprising the green phosphor material, and the phosphor layer 1080 formed along the line corresponding to the red individual pixel region may be a red phosphor layer 1080a comprising a red phosphor material.

Meanwhile, a partition wall part 1090 may be disposed between the phosphor layers 1080, and the partition wall part 1090 may block interference between light. The partition wall part 1090 may be necessarily disposed between the blue individual pixel region and the green individual pixel region and between the blue individual pixel region and the red individual pixel region and may be selectively disposed between the green individual pixel region and the red individual pixel region. The partition wall part 1090 may be formed of an inorganic material or an organic material.

Next, a method for manufacturing the display apparatus 1000 according to an embodiment of the present disclosure will be described.

First, a step of transferring the semiconductor light emitting devices 1050 on the temporary substrate 2000 so that the electrodes face upward may be performed. For example, the temporary substrate 2000 may be a substrate on which the optical gap layer 1070 is formed or may be a rigid substrate. In this case, the temporary substrate 2000 may be finally removed using a laser lift-off (LLO) method, a chemical lift-off (CLO) method, or the like after the stacking process is completed. Alternatively, in another embodiment, the temporary substrate 2000 may be the optical gap layer 1070 itself, and in this case, the process of removing the temporary substrate 2000 may be omitted.

Meanwhile, the semiconductor light emitting devices 1050 constituting the display device 1000 of the present disclosure are flip chip type semiconductor light emitting devices 1050 in which the first conductivity type electrode and the second conductivity type electrode are disposed in the same direction, the semiconductor light emitting devices 1050 may be transferred onto the temporary substrate 2000 such that the first conductive type electrode and the second conductive type electrode face upward, that is, in the stacking direction. Since the structure of the flip-chip type semiconductor light emitting devices 1050 is the same as that described above, a detailed description thereof will be omitted.

Next, a step of forming a planarization layer 1060 filling between the semiconductor light emitting devices on the temporary substrate 2000 to expose at least a portion of the top surfaces of the electrodes (the first conductive type electrode and the second conductive type electrode) included in the semiconductor light emitting device 1050 may be performed. The planarization layer 1060 may be formed to cover a portion of a side surface and a top surface of an electrode included in the semiconductor light emitting device 1050. To this end, after forming the planarization layer 1060 to cover the semiconductor light emitting devices 1050, only a partial region of the planarization layer 1060 overlapping the first conductivity type electrode and the second conductivity type electrode can be etched through a photolithography process.

The planarization layer 1060 may be formed of an insulating inorganic material and may have a single-layer structure or a multi-layer structure comprising two or more layers. In the latter case, the step of forming the planarization layer 1060 comprises a step of forming the third insulating layer 1062 on the temporary substrate 2000 and a step of forming the second insulating layer 1061 on the third insulating layer 1062. The second insulating layer 1061 and the third insulating layer 1062 may be formed of the same material or different materials and may each have an arbitrary thickness. However, the second insulating layer 1061 may be formed to cover a portion of a side surface and a portion of a top surface of an electrode included at least in the semiconductor light emitting device 1050.

Next, a step of alternately forming the first seed electrode 1040*a* and the second seed electrode 1040*b* on the exposed top surface of the electrode of the semiconductor light emitting device 1050 may be performed. In addition, the step of forming the first seed electrode 1040*a* and the second seed electrode 1040*b* comprises a step of depositing a metal seed layer for forming the seed electrode 1040 (the first seed electrode and the second seed electrode) (deposition step), and at least one of the steps of forming the first seed electrode 1040*a* and the second seed electrode 1040*b* may selectively comprise a step of applying a voltage to the metal seed layer to form a metal plating layer of a predetermined thickness on the metal seed layer (plating step). The plating step may be a step for supplementing the thickness of the electrode in order to secure a sufficient amount of current.

Meanwhile, the metal seed layer of the first seed electrode 1040*a* and the second seed electrode 1040*b* may be a layer having a thickness of several tens to several hundreds of nm, and the metal plating layer may be a layer having a thickness of several to several tens of μm. In addition, the metal seed layer may be formed of a metal having a lower reactivity than the metal plating layer, and the metal forming the seed electrode 1040 may be selected from among Ti, Al, Ag, Au, Pd, Ni, Cu, and the like.

Next, a step of forming the first insulating layer 1030 to cover the second seed electrode 1040*b* while forming the electrode hole 1031 to expose at least a portion of the top surface of the first seed electrode 1040*a* may be performed. In this step, the first insulating layer 1030 is formed to cover both the first seed electrode 1040*a* and the second seed electrode 1040*b*, and then a photolithography process is performed and thus etching may be performed on only a partial region of the first insulating layer 1030 which overlaps the first seed electrode 1040*a*.

Next, a step of forming the first electrode 1020 extending in one direction on the first insulating layer 1030 while filling the electrode hole 1031 may be performed. Through this step, the first seed electrode 1040*a* may be connected to the first electrode 1020. The electrode hole 1031 may be filled with the same material as the first electrode 1020 or may be filled with a conductive material different from that of the first electrode 1020.

Meanwhile, the first electrode 1020 may connect the first seed electrodes 1040*a* of the semiconductor light emitting devices 1050 arranged along the extension direction of the first electrode 1020 to each other, and thus the first seed electrode 1040*a* may be formed in a dot shape. On the other hand, the second seed electrodes 1040*b* are formed in the form of a line extending in a direction crossing the extension direction of the first electrode 1020, and thus the second seed electrodes 1040*b* of the semiconductor light emitting devices 1050 arranged in the corresponding direction may be connected to each other.

Next, a step of forming the base part 1010 on the first electrode 1020 may be performed. The base part 1010 may have a configuration corresponding to the substrate of the display apparatus 1000. After the base part 1010 is formed, the step of removing the temporary substrate 2000 may be selectively performed.

Meanwhile, before the semiconductor light emitting devices 1050 are transferred onto the temporary substrate 2000, a step of forming a pattern on the optical gap layer 1070 formed on the temporary substrate 2000 may be preceded.

For example, a pattern composed of an intaglio part and an embossed part may be formed on the surface of the optical gap layer 1070, and the intaglio part and the embossed part may correspond to the surfaces of the temporary substrate 2000 and the optical gap layer 1070, respectively. After the pattern formation, the semiconductor light emitting devices 1050 may be transferred to and fixed on the adhesive embossed part.

Meanwhile, in a case where the display device 1000 is formed of only the semiconductor light emitting devices 1050 that emit light of a single color (for example, in a case where only the blue (B) semiconductor light emitting devices 1050 are formed), the step of forming the phosphor layer 1080 and the partition wall part 1090 in a region overlapping one surface of the semiconductor light emitting devices 1050 may be further performed.

The phosphor layer 1080 may be formed along a specific line in which the semiconductor light emitting devices 1050 are arranged, and the specific line may be a line corresponding to green and red individual pixel regions. The partition wall part 1090 may be formed between the phosphor layers 1080, and is necessarily formed between the blue individual pixel region and the green individual pixel region and between the blue individual pixel region and the red individual pixel region, and may be selectively formed between the green individual pixel region and the red individual pixel region. In a case where the partition wall part 1090 is not formed between the green individual pixel region and the red individual pixel region, the corresponding portion may be filled by extending the phosphor layer 1080 in the horizontal direction.

As described above, in the display device and the method for manufacturing the same according to the present disclosure, the semiconductor light emitting devices 1050 are transferred onto a temporary substrate 2000 and then since electrodes which are electrically connected to the semiconductor light emitting devices 1050 through a stacking process may be formed, it is advantageous for manufacturing fine pitch and large-area displays and has the effect of securing mass productivity.

The present disclosure described above is not limited to the configuration and method of the above-described embodiments, but the embodiments may be configured by selectively combining all or part of each of the embodiments so that various modifications can be made.

What is claimed is:

1. A display device comprising:
   a base part;
   a first electrode extending in a first direction on the base part and comprising protrusions formed at predetermined intervals;
   a first insulating layer on the first electrode and comprising electrode holes through which the protrusions respectively pass;
   a first seed electrode formed on one of the protrusions and connected to the first electrode;
   a second seed electrode formed on the first insulating layer to be spaced apart from the first seed electrode;
   a plurality of semiconductor light emitting devices, wherein one of the plurality of semiconductor light emitting devices is disposed to contact the first seed electrode and the second seed electrode; and
   a planarization layer on the first insulating layer and filling spaces between the plurality of semiconductor light emitting devices,
   wherein the second seed electrode extends in a second direction intersecting the first direction.

2. The display device of claim 1, wherein the semiconductor light emitting device comprises
- a first conductivity type semiconductor layer on which a first conductivity type electrode is formed,
- an active layer formed on the first conductivity type semiconductor layer,
- a second conductivity type semiconductor layer formed on the active layer, and
- a second conductivity type electrode laterally spaced apart from the first conductivity type electrode on the second conductivity type semiconductor layer,
- wherein the first conductivity type electrode and the second conductivity type electrode are respectively connected to the first seed electrode and the second seed electrode.

3. The display device of claim 1,
- wherein the first seed electrode and the second seed electrode comprise a metal seed layer, and
- wherein at least one of the first seed electrode or the second seed electrode further comprises a metal plating layer on the metal seed layer.

4. The display device of claim 1, wherein the planarization layer comprises:
- a second insulating layer on the first insulating layer and filling at least a space between the first seed electrode and the second seed electrode, and
- a third insulating layer on the second insulating layer and comprising a black insulator.

5. The display device of claim 1, further comprising:
- an optical gap layer disposed on at least the plurality of semiconductor light emitting devices and formed of a transparent material.

6. The display device of claim 1, further comprising:
- a plurality phosphor layers each formed to overlap a corresponding subset of the plurality of semiconductor light emitting devices arranged along a line and configured to convert a wavelength of light emitted from the semiconductor light emitting devices, and
- a partition wall part formed between the phosphor layers.

* * * * *